United States Patent
Kim et al.

(10) Patent No.: US 9,630,473 B2
(45) Date of Patent: Apr. 25, 2017

(54) MOTOR DRIVING DEVICE AND METHOD FOR VEHICLE

(71) Applicants: Hyundai Motor Company, Seoul (KR); Kia Motors Corporation, Seoul (KR)

(72) Inventors: Jin Kim, Gyeonggo-Do (KR); June Kyu Park, Gyeonggo-Do (KR); Soon Myung Kwon, Gyeonggo-Do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 108 days.

(21) Appl. No.: 14/620,562

(22) Filed: Feb. 12, 2015

(65) Prior Publication Data

US 2016/0116538 A1 Apr. 28, 2016

(30) Foreign Application Priority Data

Oct. 22, 2014 (KR) ........................ 10-2014-0143497

(51) Int. Cl.
*G01R 31/34* (2006.01)
*B60H 1/00* (2006.01)

(52) U.S. Cl.
CPC ....... *B60H 1/00428* (2013.01); *G01R 31/343* (2013.01)

(58) Field of Classification Search
CPC .... B60H 1/00428; F04D 15/00; G01R 31/343
USPC .................................................. 324/765.01
See application file for complete search history.

(56) References Cited

U.S. PATENT DOCUMENTS

| | | | |
|---|---|---|---|
| 2009/0096394 A1* | 4/2009 | Taniguchi | H02M 1/32 318/400.09 |
| 2010/0168946 A1* | 7/2010 | Snyder | B60L 15/2009 701/22 |

FOREIGN PATENT DOCUMENTS

| | | |
|---|---|---|
| JP | H05130795 A | 5/1993 |
| JP | 1994-013397 U | 2/1994 |
| JP | 1994-098593 | 4/1994 |
| JP | 2008-199852 | 8/2008 |
| JP | 2008-206276 A | 9/2008 |
| JP | 2013-013257 A | 1/2013 |
| JP | 2013-207975 A | 10/2013 |
| KR | 10-2003-0085340 A | 11/2003 |
| KR | 10-0760854 B | 9/2007 |
| KR | 10-2013-0056936 A | 5/2013 |

* cited by examiner

*Primary Examiner* — Thomas Valone
(74) *Attorney, Agent, or Firm* — Mintz Levin Cohn Ferris Glovsky and Popeo, P.C.; Peter F. Corless

(57) ABSTRACT

A motor driving device and method for a vehicle are provided to adjust and diagnose an air-conditioning motor by sensing an output signal and a current of a feedback sensor. The motor driving device includes a feedback sensor that configured to output a feedback voltage by detecting a rotation angle of a motor. In addition, a controller is configured to generate a substantially constant current that corresponds to an operation state of the motor and determine a driving state of the motor by combining the constant current with the feedback voltage.

12 Claims, 9 Drawing Sheets

MOTOR DRIVING DEVICE AND METHOD FOR VEHICLE

CROSS-REFERENCE TO RELATED APPLICATION

The priority of Korean patent application No. 10-2014-0143497 filed on Oct. 22, 2014, the disclosure of which is hereby incorporated in its entirety by reference, is claimed.

BACKGROUND

The present invention relates to a motor driving device and method for a vehicle, and more particularly to a technology for controlling and diagnosing an air-conditioning motor by sensing an output signal and a current of a feedback sensor. Generally, a Heating, Ventilation, and Air Conditioning (HVAC) system that adjusts indoor temperature of a vehicle and implements a more comfortable or pleasant environment is mounted within the vehicle. Recently, Full Automatic Temperature Control (FATC) systems configured to maintain a comfortable environment by automatically adjusting indoor temperature according to a setting temperature selected by a vehicle driver or passenger are embedded in many vehicles.

In accordance with the FATC system, when a driver or passenger within the vehicle in which the FATC system is mounted selects a setting temperature, an air-conditioning controller (i.e., FATC controller) is configured to receive sensor detection signals from various sensors used for adjusting indoor temperature, for example, a solar-radiation sensor configured to detect the amount of solar radiation, an outdoor-temperature sensor configured to detect outdoor temperature, and an indoor-temperature sensor configured to detect indoor temperature of the vehicle, so that the FATC system can efficiently adjust indoor temperature of the vehicle. The FATC system may be configured to calculate thermal load of an indoor space based on detection values of various sensors. The FATC system is also configured to determine a discharge mode, a discharge temperature, a discharge direction, a discharge airflow, etc.

To adjust indoor temperature and system operations, the FATC controller is configured to receive detection values from a discharge-temperature sensor configured to detect a discharge temperature, a heater temperature sensor configured to detect a temperature of an electric heater (e.g., a positive temperature coefficient (PTC) heater) (i.e., an auxiliary heater in case of an internal combustion engine vehicles, and a main heater in case of an electric vehicle), and an evaporator temperature sensor configured to detect an evaporator temperature. Further, to adjust the supply of the air-conditioning air according to the determined discharge mode, the determined discharge temperature, the determined discharge direction, and the discharge airflow, a mode actuator, a temperature door (i.e., a temperature control door), an actuator, an actuator, a fan-control-door actuator, an air-conditioning blower, a compressor, an electric heater, etc. are controlled.

FIG. 1 is an exemplary equivalent circuit of a conventional air-conditioning motor device according to the related art. Referring to FIG. 1, the conventional air-conditioning motor device includes a motor M, a motor driver 10, and a feedback sensor 20. The motor driver 10 is configured to output a drive voltage to drive the motor M upon receiving a power-supply voltage VCC. The feedback sensor 20 is configured to detect a driving angle of the motor M and output the detected driving angle as a voltage value. The feedback sensor 20 may be driven by a reference voltage (Ref) (for example, about 5V).

FIG. 2 is an exemplary schematic diagram illustrating the conventional air-conditioning motor device that operates in a normal mode according to the related art. In FIG. 2, it may be assumed that a target drive voltage of the motor M is set to 4V. When a voltage detected by the feedback sensor 20 is set to 4V, the controller 30 is configured to feed back a target position of the motor M in response to an output signal of the feedback sensor 20.

FIGS. 3 to 5 illustrate exemplary cases in which a faulty operation or malfunction occurs in the conventional air-conditioning motor device. Referring to FIG. 3, when an abnormal stall occurs in the motor M having a target voltage of 4V, the sensing voltage of the feedback sensor 20 may be detected as a voltage of 3V. Although the motor M of the conventional air-conditioning motor device is stalled, a drive current may be continuously applied to the motor M.

Referring to FIG. 4, although a target voltage of the motor M is set to 4V, when a terminal for interconnecting the motor M and the controller 30 is severed or cut off, the sensing voltage of the feedback sensor 20 may be set to 3V. When a broken wire or a disconnection part occurs in the motor M, the motor M does not move to a target position. The conventional air-conditioning motor device is designed to apply a drive current to the motor M during a predetermined time (e.g., about 10 seconds) even when a wire of the motor M is opened.

Referring to FIG. 5, although the motor M has a target voltage of 4V, when a terminal for interconnecting the motor M and the controller 30 is short-circuited, the sensing voltage of the feedback sensor 20 may be detected as another voltage. When the motor M is short-circuited, the motor M does not move to the target position. The conventional air-conditioning motor device is designed to apply a drive current to the motor M during a predetermined time (e.g., about 10 seconds) even when a wire of the motor M is short-circuited.

As described above, a faulty operation or malfunction may occur in the motor M due to various reasons such as an abnormal stall, short-circuiting, a broken wire, etc. However, the conventional air-conditioning motor device determines a state of the motor M using only the output value of the feedback sensor 30.

In particular, it may be difficult for the conventional air-conditioning motor device to correctly recognize whether a control error of the motor M occurs due to an abnormal stall, a broken wire, or short-circuiting, as shown in FIGS. 3 to 5. Accordingly, a drive current is applied to the conventional air-conditioning motor device during a timeout interval and the drive current may unavoidably affect durability of the motor and constituent components thereof, so that the conventional air-conditioning motor device may have difficulty in correctly recognizing the actual failure mode.

SUMMARY

Various exemplary embodiments of the present invention are directed to providing a motor driving device and method for a vehicle that substantially obviates one or more problems due to limitations and disadvantages of the related art. An exemplary embodiment of the present invention relates to a motor driving device for a vehicle which detects a motor state by sensing an output signal and a current of a feedback sensor, adjusts an air-conditioning motor in response to the detected state, and more accurately diagnoses a failure in motor driving.

In accordance with an aspect of the exemplary embodiment, a motor driving device for a vehicle may include: a feedback sensor configured to output a feedback voltage by detecting a rotation angle of a motor; and a controller configured to generate a substantially constant current that corresponds to an operation state of the motor, and determine a driving state of the motor by combining the constant current with the feedback voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings.

DETAILED DESCRIPTION

Figure 1:
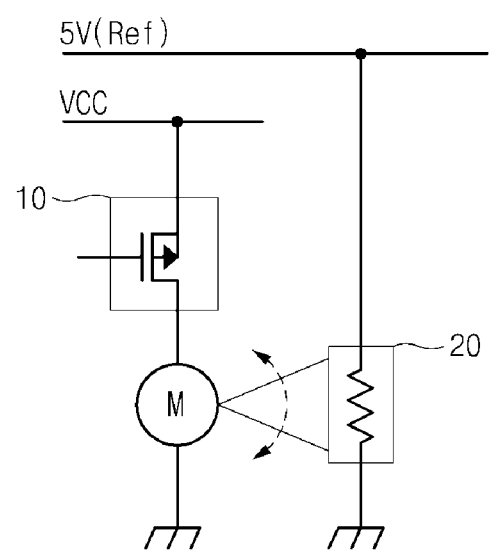
FIG. 1 is an exemplary equivalent circuit of a conventional air-conditioning motor device according to the related art.
Figure 2:
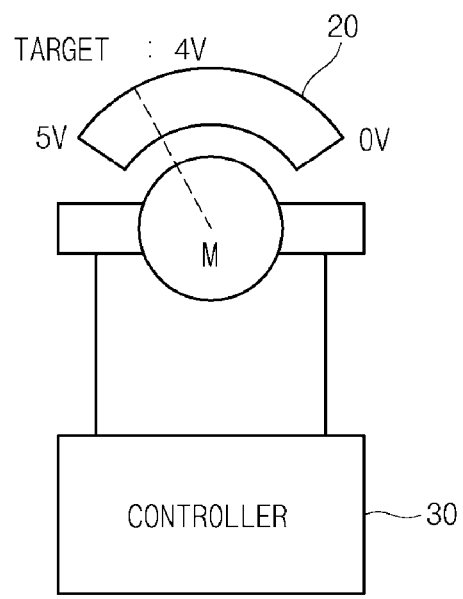
FIG. 2 is an exemplary schematic diagram illustrating the conventional air-conditioning motor device that operates in a normal mode according to the related art.
Figure 3:
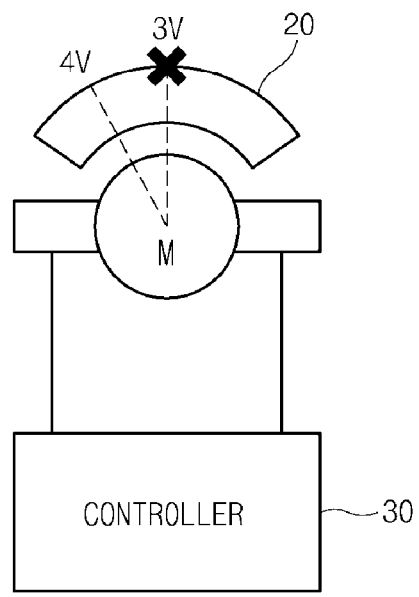
FIGS. 3 to 5 illustrate exemplary cases in which a faulty operation or malfunction occurs in the conventional air-conditioning motor device according to the related art.
Figure 4:
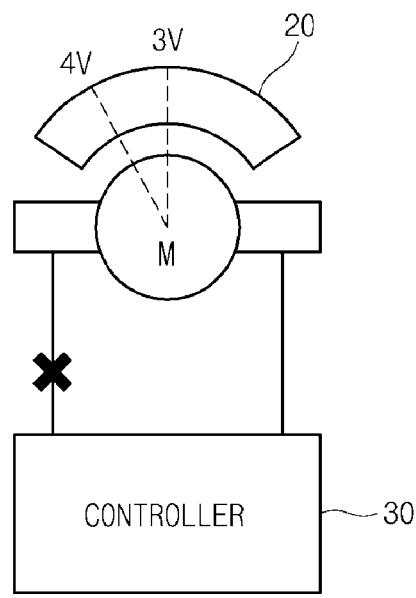
Figure 5:
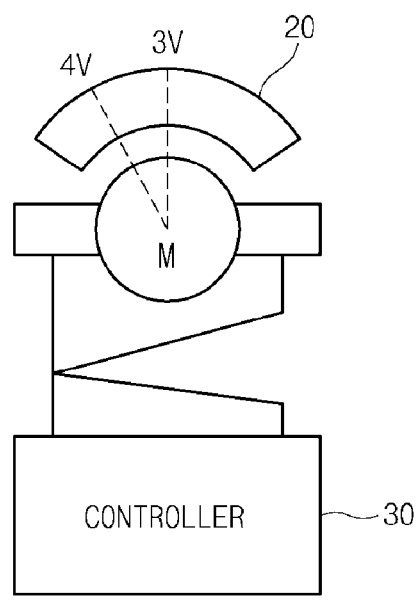

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Reference will now be made in detail to the exemplary embodiments of the present invention, examples of which are illustrated in the accompanying drawings. Wherever possible, the same reference numbers will be used throughout the drawings to refer to the same or like parts.

Figure 6:
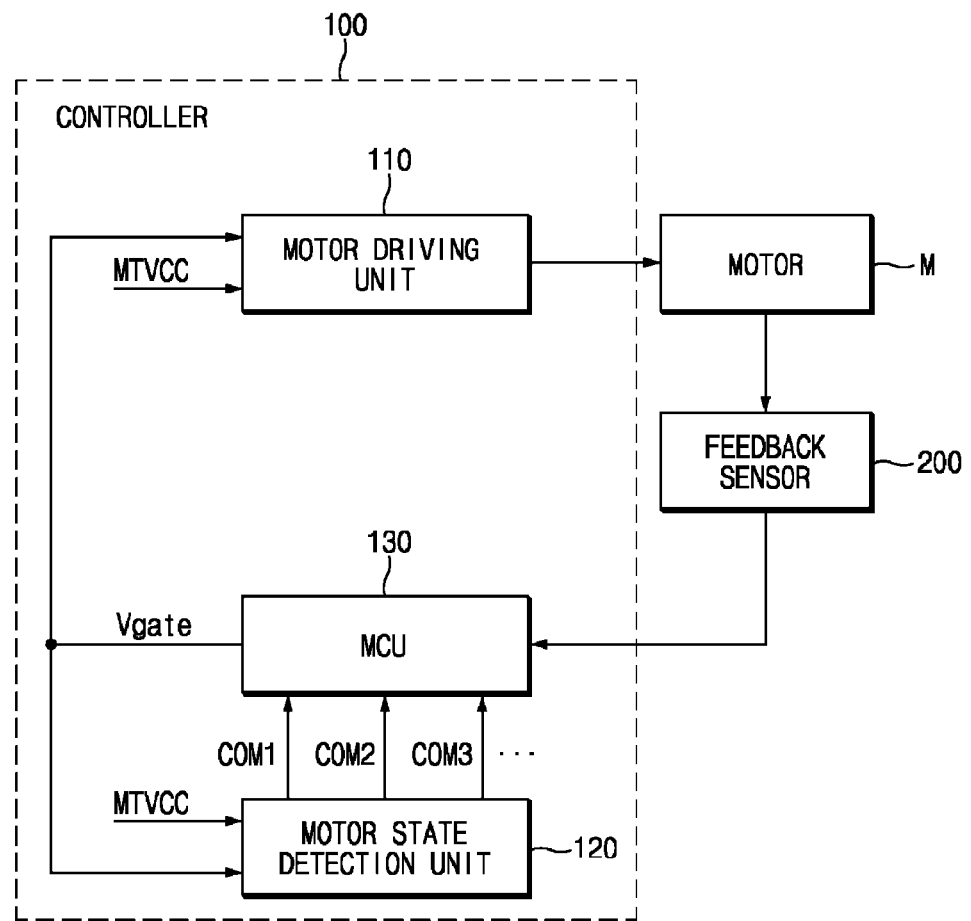
FIG. 6 is an exemplary block diagram illustrating a motor driving device for a vehicle according to an exemplary embodiment of the present invention.

FIG. 6 is an exemplary block diagram illustrating a motor driving device for a vehicle according to an exemplary embodiment. Referring to FIG. 6, the motor driving device according to the exemplary embodiment may include a controller 100, a motor M, and a feedback sensor 200. In particular, the controller 100 may include and may be configured to operate a motor driving unit 110, a motor state detection unit 120, and a motor control unit (MCU) 130.

The controller 100 may be configured to combine a feedback voltage sensed by the feedback sensor 200 with an internal current value, operate the motor M using the combination result, and diagnose whether a faulty operation occurs in the motor M. As a result, a function and quality of a motor control operation in response to an operation state of the motor M, and durability of the motor M may be guaranteed.

The feedback sensor 200 may be configured to detect a rotation angle of the motor M, and output a feedback voltage to the controller 100. When a change of the feedback voltage received from the feedback sensor 200 is not detected during a predetermined time or longer (e.g., about 10 seconds or longer), the controller 100 may be configured to determine the occurrence of a stall state. In particular, the feedback sensor 200 may be configured to change a rotation angle (e.g., about 0°~150°) of the motor M into an analog voltage value (e.g., about 0V~5V) that correspond to a specific range. The feedback sensor 200 may be configured to transmit an analog value that indicates a correct position of the rotating motor M to the motor control unit (MCU) 130, to correctly implement a user-desired rotation angle.

The motor driving unit 110 may be configured to operate the motor M in response to a drive voltage (MTVCC) received from a high-voltage battery and a gate voltage (Vgate) received from the MCU 130. In addition, the motor state detection unit 120 may be driven by the drive voltage (MTVCC) received from the high-voltage battery and the gate voltage (Vgate) received from the MCU 130. The motor state detection unit 120 may be configured to output a plurality of sense signals (COM1~COM3) that have different current values to the MCU 130 in response to a constant current that corresponds to a state of the motor M. Particularly, the motor state detection unit 120 may be implemented as a semiconductor circuit configured to perform current mirroring.

The MCU 130 may be configured to output the gate voltage (Vgate) to the motor driving unit 110 and the motor state detection unit 120. The MCU 130 may also be configured to combine a feedback voltage received from the feedback sensor 200 with a plurality of sense signals (COM1~COM3) received from the motor state detection unit 120, and determine a state of the motor M based on the combination result. Further, the MCU 130 may be configured to determine that the feedback voltage received from the feedback sensor 200 has priority, and several sense signals (COM1~COM3) received from the motor state detection unit 120 may have the same priority. The MCU 130 may access a previously stored position of a start point of the opening/closing angle obtained before the motor M starts operation. The MCU 130 may also be configured to output the gate voltage (Vgate) to the MCU 110 to drive the motor M until the motor M reaches a target voltage.

Figure 7:
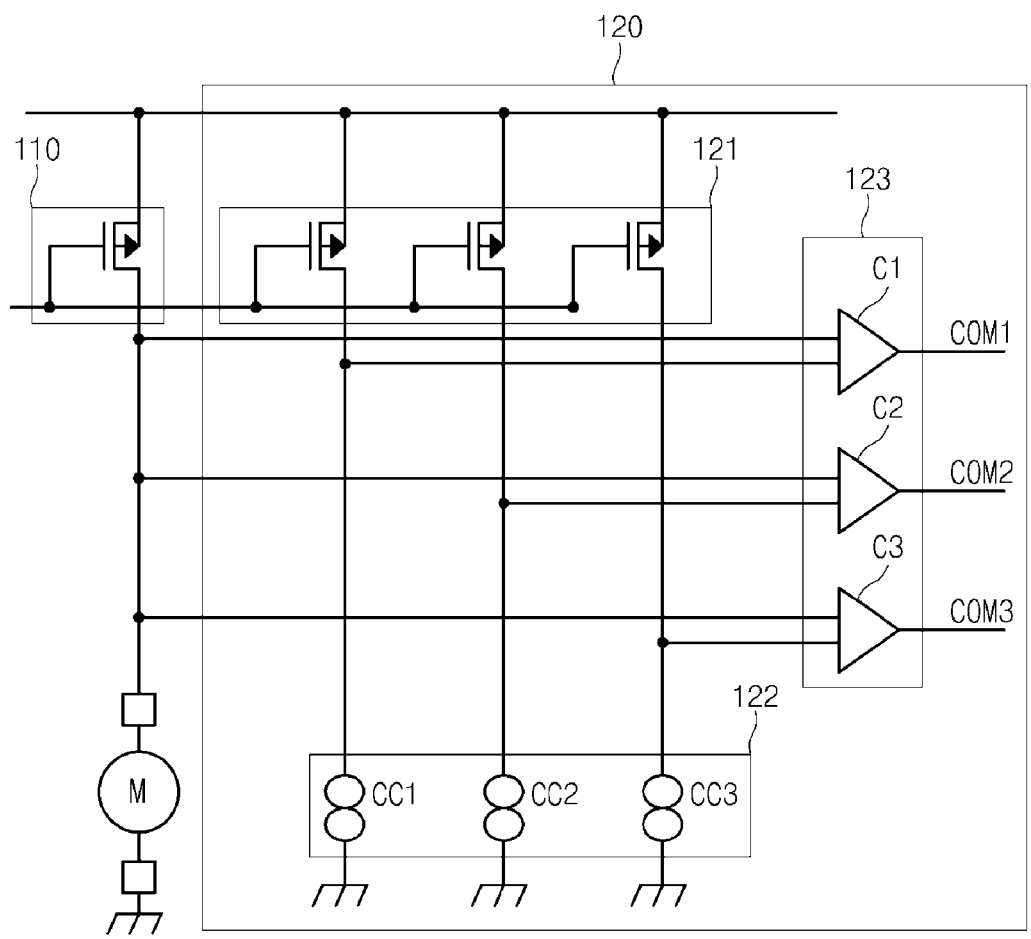
FIG. 7 is an exemplary detailed circuit diagram illustrating a motor-state detection unit shown in FIG. 6 according to an exemplary embodiment of the present invention.

FIG. 7 is an exemplary detailed circuit diagram illustrating the motor-state detection unit 120 shown in FIG. 6. Referring to FIG. 7, the motor state detection unit 120 may include a drive unit 121, a current generator, and a comparator 123.

The drive unit 121 may be configured to selectively output the drive voltage (MTVCC) to the comparator 123 in response to the gate voltage (Vgate). The drive unit 121 may include a plurality of transistors. The transistors may be coupled between an input terminal of the drive voltage (MTVCC) and the comparator 123, to allow each transistor to receive the gate voltage (Vgate) via a gate terminal thereof. In other words, the drive unit 121 may be configured to output the drive voltage (MTVCC) to an input terminal of the comparator 123 when the gate voltage (Vgate) is activated, to allow the comparator 123 to begin a comparison process.

The current generator 122 may include a plurality of constant current sources (CC1~CC3). The constant current sources (CC1~CC3) may be coupled between the drive unit 121 and a ground voltage terminal to generate a substantially constant current. In particular, the constant current sources (CC1~CC3) may be mapped to a plurality of transistors contained in the drive unit 121 on a one to one basis. The constant current sources (CC1~CC3) may respectively be configured to adjust current values and output the adjusted constant currents to the comparator 123. The current values being respectively output from the constant current sources (CC1~CC3) may be changed as necessary.

Additionally, the constant current source CC1 may be configured to generate a current that corresponds to sensing of a stall state, and may output the generated current to the comparator 123. The constant current source CC2 may be configured to generate a current that corresponds to sensing of an under-state, and may output the generated current to the comparator 123. Further, the constant current source CC3 may be configured to generate a current that corresponds to sensing of an over-state, and may output the generated current to the comparator 123.

Although the motor driving device according to the exemplary embodiment outputs three signals associated with stall-state sensing, under-state sensing, and over-state sensing in response to three constant current sources (CC1~CC3) for convenience of description and better understanding of the present invention, the scope or spirit of the present invention is not limited thereto, and the number of constant current sources may also be changed as necessary.

The stall current generated from the constant current source CC1 may indicate that an abnormal stall current occurs in the motor M. The under current generated from the constant current source CC2 may indicate that a terminal for interconnecting the motor M and the controller 100 is severed or cut off. The overcurrent generated from the constant current source CC3 may indicate that a terminal for interconnecting the motor M and the controller 100 is short-circuited.

The comparator 123 may be configured to compare the output signal of the drive unit 121 with the output signal of the current generator 122, and may output a plurality of sense signals (COM1~COM3) to the MCU 130. The comparator 123 may include a plurality of comparators (C1~C3). The comparators (C1~C3) may respectively be configured to receive output signals of the drive unit 121 via each first terminal, and may respectively be configured to receive output signals of the current generator 122 via each second terminal.

Figure 8:
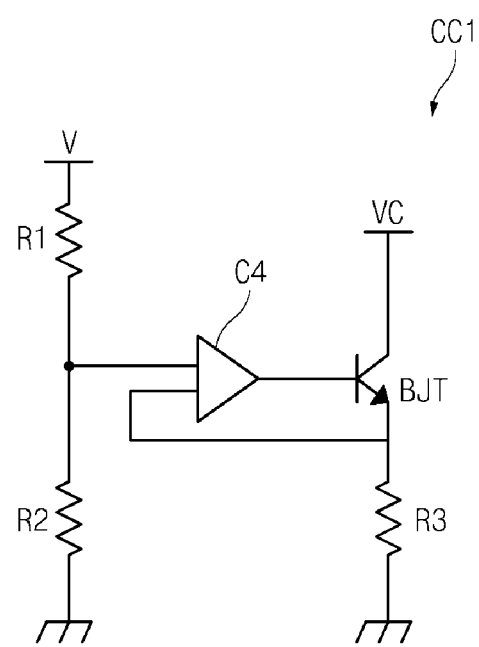
FIG. 8 is an exemplary detailed circuit diagram illustrating a current generator shown in FIG. 7 according to an exemplary embodiment of the present invention.

FIG. 8 is an exemplary detailed circuit diagram illustrating the current generator 122 shown in FIG. 7. A plurality of constant current sources (CC1~CC3) contained in the current generator 122 may have the same structures as shown in FIG. 8, thus a detailed circuit diagram of one constant current source CC1 from among the constant current sources (CC1~CC3) will hereinafter be described for convenience of description and better understanding of the present invention.

The constant current source CC1 may include a plurality of resistors (R1~R3), a comparator C4, and a transistor (BJT). The resistors R1 and R2 may correspond to a voltage divider and may be coupled in series between a voltage (V) input terminal and a ground terminal, to allow the resistors (R1, R2) to perform division of the voltage V at a predetermined ratio. The ratio of the voltage divided by the voltage divider may also be changed to another ratio without departing from the scope or spirit of the present invention. Additionally, the comparator C4 may be configured to receive an output signal of the voltage divider and a feedback result of the output signal of the transistor (BJT), compare the received output signal of the voltage divider with the feedback result of the output signal of the transistor (BJT), and output the result of comparison to a base terminal of the transistor (BJT).

The transistor (BJT) may be coupled between the voltage (VC) and the resistor, to allow the transistor (BJT) to be implemented as a bipolar junction transistor that receives an output signal of the comparator C4 via a base terminal. In addition, the resistor R3 may be coupled between the transistor (BJT) and a ground terminal. A plurality of sense signals (COM1~COM3) generated from the comparator 123 may be output to the MCU 130. The MCU 130 may be configured to combine a feedback voltage generated from the feedback sensor 200 with the sense signals (COM1~COM3) received from the motor state detection unit 120, and may be configured to determine a state of the motor M based on the combination result.

Various situations in which the MCU 130 recognizes various states of the motor M are shown in the following Table 1.

TABLE 1

| Current Input | Change completion of Sensor Value | Stall sensing | Under sensing | Over sensing | Diagnosis Result |
|---|---|---|---|---|---|
| o | o | — Don't Care | x | x | Normal driving of Motor |
| o | x | o | x | x | Abnormal Stall of Motor |
| o | x | x | o | x | Motor Open |
| o | x | x | x | o | Motor Short |
| o | x | x | x | x | Control error |
| x | o | x | x | x | Motor is driven by the influence of external environment |
| x | x | o | x | x | Control error or Semiconductor malfunction |
| x | x | x | o | x | Control error or Semiconductor malfunction |
| x | x | x | x | o | Control error or Semiconductor malfunction |
| x | x | x | x | x | Control error or Semiconductor malfunction |

As can be seen from Table 1, in response to the sense signals (COM1~COM3) received from the motor state detection unit 120 and an indication signal indicating whether the sensor value of the feedback sensor 200 has been changed, the MCU 130 may be configured to determine whether a faulty operation or malfunction occurs in the motor M.

Figure 9:
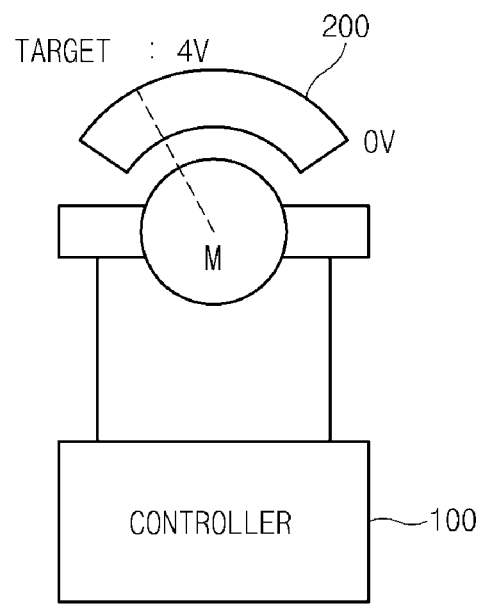
FIGS. 9 to 14 illustrate exemplary cases in which a faulty operation or malfunction occurs in an air-conditioning motor device according to an exemplary embodiment of the present invention.

For example, it may be assumed that the motor driving unit 110 operates to apply a drive current to the motor M. When a change of the sensor value of the feedback sensor 200 is detected, and when the sense signals (COM2, COM3) respectively indicating the under state and the over state are not received from the motor state detection unit 120, the MCU 130 may be configured to determine that the motor M is operating normally (e.g., without any errors) as shown in FIG. 9. In particular, the sense signal (COM1) for indicating the stall sensing may indicate a "Don't care" state.

Figure 10:
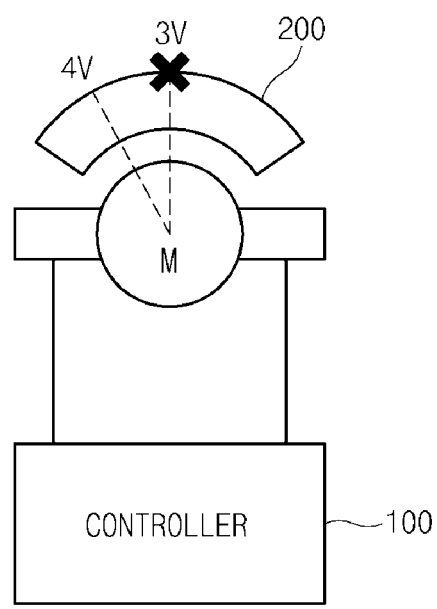

Further, it may be assumed that the motor driving unit 110 operates to apply the drive current to the motor M. When the change of the sensor value of the feedback sensor 200 is not detected, and when the sense signal (COM1) indicating the stall sensing is received from the motor state detection unit 120, the MCU 130 may be configured to determine that the motor M is in an abnormal stall state as shown in FIG. 10. Since a frozen part or the presence of a foreign material may unexpectedly occur during control of the motor M, the motor M may stall.

Figure 11:
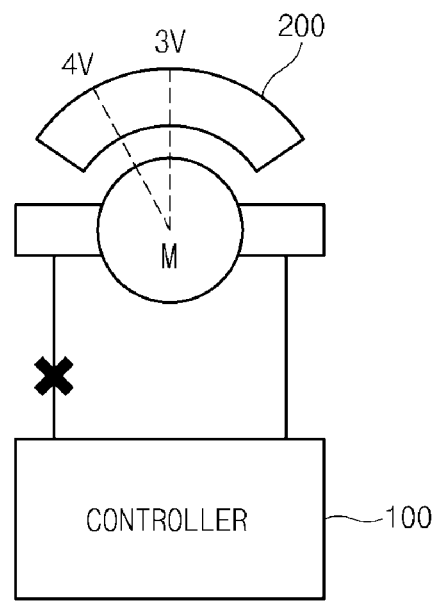
Figure 12:
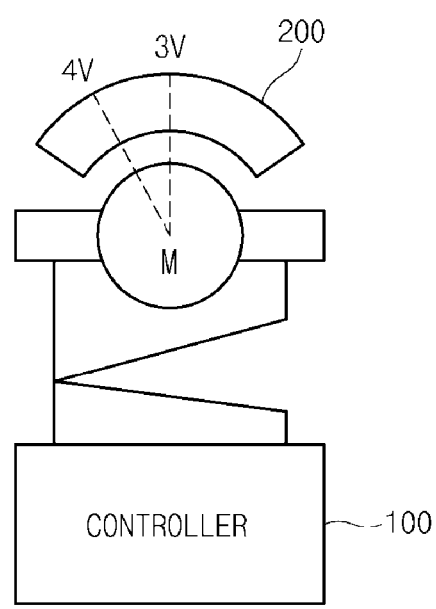

Additionally, it may be assumed that the motor driving unit 110 operates to apply a drive current to the motor M. When the MCU 130 does not detect a variation in the sensor value received from the feedback sensor 200 and receives the sense signal (COM2) indicating the under state from the motor state detection unit 120, the MCU 130 may be configured to determine that the motor M has a broken wire as shown in FIG. 11. When the MCU 130 does not detect a variation in the sensor value received from the feedback sensor 200 and receives the sense signal (COM3) indicating the over state from the motor state detection unit 120, the MCU 130 may be configured to determine that the motor M is short-circuited as shown in FIG. 12.

Figure 13:
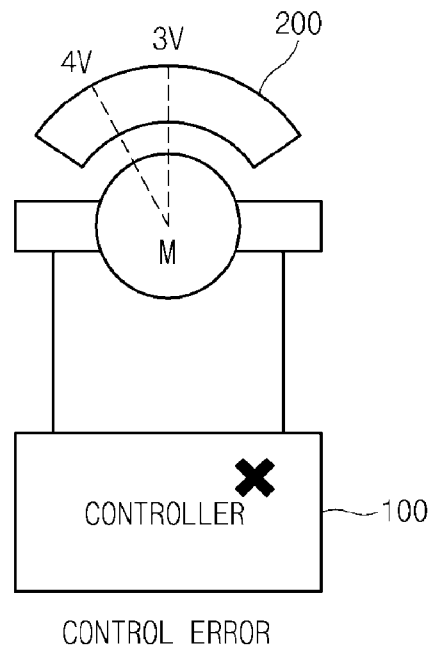

When the MCU 130 does not detect a variation in the sensor value received from the feedback sensor 200 and does not receive all sense signals (COM1~COM3) indicating the stall state, the under state, and the over state from the motor state detection unit 120, the MCU 130 may be configured to determine the occurrence of errors within the controller 100 as shown in FIG. 13.

Figure 14:
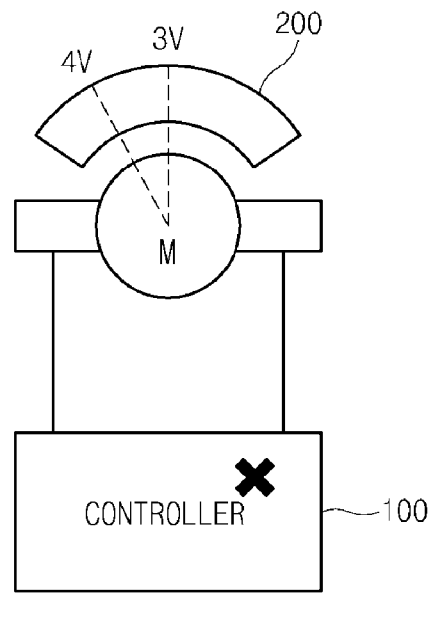

In addition, when it is assumed that the motor driving unit 110 is not operated to prevent a drive current from being applied to the motor M and when the MCU 130 detects a variation in the sensor value received from the feedback sensor 200 and does not receive all sense signals (COM1~COM3) indicating the stall state, the under state, and the over state from the motor state detection unit 120, the MCU 130 may be configured to determine the occurrence of errors due to the influence of external environments. When the MCU 130 does not detect a variation in the sensor value received from the feedback sensor 200 and receives the sense signal (COM1) indicating the stall state from the motor state detection unit 120, the MCU 130 may be configured to determine that a faulty operation or a semiconductor failure occurs in the controller 100 as shown in FIG. 14.

Likewise, it may be assumed that the motor driving unit 110 is not operated to prevent a drive current from being applied to the motor M. When the MCU 130 does not detect a variation in the sensor value received from the feedback sensor 200 and receives the sense signal COM2 or COM3 indicating the under state or the over state from the motor state detection unit 120, the MCU 130 may be configured to determine that a faulty operation or a semiconductor failure occurs in the controller 100.

Further, it may be assumed that the motor driving unit 110 is not operated to prevent a drive current from being applied to the motor M. When the MCU 130 does not detect variation in the sensor value received from the feedback sensor 200 and does not receive the sense signals (COM1~COM3) indicating the stall state, the under state, and the over state from the motor state detection unit 120, the MCU 130 may be configured to determine that the faulty operation does not occur in the motor M.

As is apparent from the above description, the exemplary embodiments of the present invention have the following effects.

First, the exemplary embodiments may more accurately diagnose a current operation state of the motor, resulting in improvement of a function and quality of the motor.

Second, the exemplary embodiments may prevent the occurrence of a faulty operation caused by overcurrent applied to the motor, resulting in increased durability of the motor and the motor driver.

Third, the exemplary embodiments may diagnose and analyze motor-associated issues of the air-conditioning system in early stage.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A motor driving device for a vehicle, comprising:
   a feedback sensor configured to output a feedback voltage by detecting a rotation angle of a motor; and
   a controller configured to determine a state in which the motor is driven based on the feedback voltage and a substantially constant current that corresponds to an operation state of the motor.

2. The motor driving device according to claim 1, wherein the controller includes:
   a motor driving unit configured to generate a drive current for driving the motor;
   a motor state detection unit configured to generate the substantially constant current, compare the substantially constant current with the drive current, and output a sense signal based on the comparison result; and
   a motor control unit (MCU) configured to determine the state in which the motor is driven based on the feedback voltage and the sense signal.

3. The motor driving device according to claim 2, wherein the motor driving unit is controlled by a gate voltage received from the motor control unit (MCU).

4. The motor driving device according to claim 3, wherein the motor state detection unit includes:
   a drive unit controlled by the gate voltage received from the motor control unit (MCU) and by a drive voltage received from a high-voltage battery;
   a current generator configured to generate the substantially constant current; and
   a comparator configured to output the sense signal by comparing an output signal of the drive unit with an output signal of the current generator.

5. The motor driving device according to claim 4, wherein the current generator includes a plurality of constant current sources configured to generate the substantially constant current used to determine the state in which the motor is driven.

6. The motor driving device according to claim 5, wherein each of the constant current sources includes:
   a voltage divider configured to perform voltage division;
   a transistor and a resistor coupled in series between a power-source terminal and a ground terminal; and
   a comparator configured to operate the transistor by comparing an output signal of the voltage divider with an output signal of the transistor.

7. The motor driving device according to claim 6, wherein the voltage divider includes a plurality of resistors through which the ratio of voltage division is changed.

8. The motor driving device according to claim 4, wherein the current generator is configured to detect at least one selected from the group consisting of: a stall state, an under state, and an over state of the motor.

9. The motor driving device according to claim 4, wherein the comparator includes a plurality of comparators configured to detect a plurality of sense signals by detecting at least one selected from the group consisting of: a stall state, an under state, and an over state of the motor.

10. The motor driving device according to claim 2, wherein the motor control unit (MCU) enables the feedback voltage to have priority for determining the state in which the motor is driven, and the plurality of sense signals for determining the state in which the motor is driven has the same priority.

11. A motor driving method for a vehicle, comprising:
    receiving, by a controller, a feedback voltage from a feedback sensor by detecting a rotation angle of a motor;
    generating, by the controller, a substantially constant current that corresponds to a state in which the motor is driven;
    determining, by the controller, the state in which the motor is driven based on the substantially constant current and the feedback voltage;
    generating, by the controller, a drive current for driving the motor; and
    comparing, by the controller, the substantially constant current with the drive current, and outputting a sense signal based on the comparison results.

12. The motor driving method according to claim 11, wherein at least one selected from the group consisting of: a stall state, an under state, and an over state of the motor is detected.

* * * * *